United States Patent
Yang et al.

(10) Patent No.: US 11,360,339 B2
(45) Date of Patent: Jun. 14, 2022

(54) DISPLAY ASSEMBLY AND MANUFACTURING METHOD FOR DISPLAY ASSEMBLY

(71) Applicant: Beijing Xiaomi Mobile Software Co., Ltd., Beijing (CN)

(72) Inventors: Jie Yang, Beijing (CN); Feng Liu, Beijing (CN); Shihwei Lu, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 17/146,825

(22) Filed: Jan. 12, 2021

(65) Prior Publication Data
US 2021/0405431 A1    Dec. 30, 2021

(30) Foreign Application Priority Data
Jun. 30, 2020  (CN) ..................... 202010623013.X

(51) Int. Cl.
| | |
|---|---|
| *G02F 1/1333* | (2006.01) |
| *F21V 8/00* | (2006.01) |
| *G02F 1/1335* | (2006.01) |
| *H01L 51/52* | (2006.01) |
(Continued)

(52) U.S. Cl.
CPC ..... *G02F 1/133325* (2021.01); *G02B 6/0088* (2013.01); *G02F 1/133314* (2021.01); *G02F 1/133331* (2021.01); *G02F 1/133512* (2013.01); *H01L 51/5237* (2013.01);
(Continued)

(58) Field of Classification Search
None
See application file for complete search history.

(56) References Cited

U.S. PATENT DOCUMENTS

| | | | | |
|---|---|---|---|---|
| 7,112,864 B2 * | 9/2006 | Tsukamoto | ............... | G02B 7/02 |
| | | | | 257/433 |
| 7,759,751 B2 * | 7/2010 | Ono | ................... | H01L 27/14618 |
| | | | | 257/432 |
| 9,394,465 B2 * | 7/2016 | Inenaga | ................... | G06F 3/045 |
| | | (Continued) | | |

FOREIGN PATENT DOCUMENTS

| | | |
|---|---|---|
| JP | 2009109855 A | 5/2009 |
| JP | 2011209470 A | 10/2011 |
| | (Continued) | |

OTHER PUBLICATIONS

Extended European Search Report in European Application No. 21151908.7, dated Jul. 1, 2021.
(Continued)

*Primary Examiner* — Vip Patel
(74) *Attorney, Agent, or Firm* — Finnegan, Henderson, Farabow, Garrett & Dunner, L.L.P.

(57) ABSTRACT

The disclosure relates to a display assembly and a manufacturing method for the display assembly. The display assembly includes a frame, a display panel, and protective glass; wherein the display panel is attached onto the inner surface of the protective glass to form an integrated structure, an edge of the inner surface of the protective glass extends beyond the display panel, and the edge of the inner surface of the protective glass is bonded to a surface of a side wall of the frame by a bonding agent.

12 Claims, 4 Drawing Sheets

(51) Int. Cl.
*H01L 51/56* (2006.01)
*H01L 27/32* (2006.01)

(52) U.S. Cl.
CPC .......... *H01L 51/56* (2013.01); *G02F 2202/28* (2013.01); *H01L 27/3211* (2013.01)

(56) References Cited

U.S. PATENT DOCUMENTS

| | | |
|---|---|---|
| 2015/0253615 A1 | 9/2015 | Ryu et al. |
| 2016/0147260 A1 | 5/2016 | Huang et al. |
| 2018/0314091 A1 | 11/2018 | Kwon |
| 2019/0285940 A1 | 9/2019 | Yonemura |

FOREIGN PATENT DOCUMENTS

| | | |
|---|---|---|
| JP | 2012123231 A | 6/2012 |
| JP | 2013088527 A | 5/2013 |
| JP | 2015200724 A | 11/2015 |
| JP | 2016194670 A | 11/2016 |

OTHER PUBLICATIONS

Notice of Reasons for Refusal for Japanese Application No. 2021-018017, dated Jan. 11, 2022.

* cited by examiner

US 11,360,339 B2

DISPLAY ASSEMBLY AND MANUFACTURING METHOD FOR DISPLAY ASSEMBLY

CROSS-REFERENCE TO RELATED APPLICATIONS

This application is based upon and claims priority to Chinese Patent Application No. 202010623013.X, filed on Jun. 30, 2020, the entire contents of which are incorporated herein by reference.

TECHNICAL FIELD

The present disclosure relates to the field of display apparatus, and in particular to a display assembly and a manufacture method for the display assembly.

BACKGROUND

FIG. 1 is a schematic diagram of a conventional display assembly. In FIG. 1, a display panel 20 is installed on a frame 10. The display panel 20 includes a display area 22 located at a center and a black edge area 21 located on an edge, and the black edge area 21 is disposed around a periphery of the display area 22. In order to avoid shielding of the display area 22 as much as possible, which may influence the display effect of the display panel 20, a double sided tape 30 is generally disposed between the black edge area 21 on a back face of the display panel 20 and the frame 10 so as to fixedly bond the display panel 20 and the frame 10. This method for fixing the display panel 20 with the frame 10 is generally suitable for the display panel 20 having the black edge area 21 with a larger width. For example, it is suitable for the display panel 20 of which the black edge area 21 has a width of 6.5 mm or over 6.5 mm. If the width of the black edge area 21 is small, the display panel 20 may not be bonded to the frame 10 directly.

SUMMARY

According to a first aspect of embodiments of the disclosure, a display assembly includes: a frame, a display panel, and a protective glass; wherein the display panel is attached onto an inner surface of the protective glass to form an integrated structure, an edge area of the inner surface of the protective glass extends beyond the display panel, and the edge area of the inner surface of the protective glass is bonded to a surface of a side wall of the frame by a bonding agent.

According to a second aspect of the embodiments of the disclosure, a manufacturing method for the display assembly includes: attaching a display panel onto an inner surface of protective glass to form an integrated structure, wherein an edge area of the inner surface of the protective glass extends beyond the display panel; and bonding the inner surface of the protective glass to a surface of a side wall of the frame by a bonding agent.

The technical scheme provided by the embodiments of the disclosure may include the following beneficial effects:

According to the embodiments, the display panel is indirectly fixed on the frame by the protective glass, and the display panel may not be in contact with the frame. As for a display panel with a small black edge area, the display panel does not need to realize a connection with the protective glass by the black edge area, and the display panel can be installed by the part, extending beyond the display panel, of the protective glass. This installation mode is not influenced by the width of the black edge area of the display panel. The installation space of the display panel can be increased by the protective glass and thus the display panel can be installed conveniently. Since the display panel with the small black edge area may be used, a screen-to-body ratio can be increased and a frame-free effect can be enhanced. In addition, the inner surface of the protective glass is bonded to the surface of the side wall of the frame, and the whole protective glass can be seen from the front face of the display assembly, so that user experience is improved.

It should be understood that above general description and the detailed description below are exemplary and explanatory only, and do not limit the disclosure.

BRIEF DESCRIPTION OF THE DRAWINGS

The accompanying drawings herein, which are incorporated in and constitute a part of this specification, illustrate embodiments consistent with the disclosure and, together with the description, serve to explain the principles of the disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Figure 2:
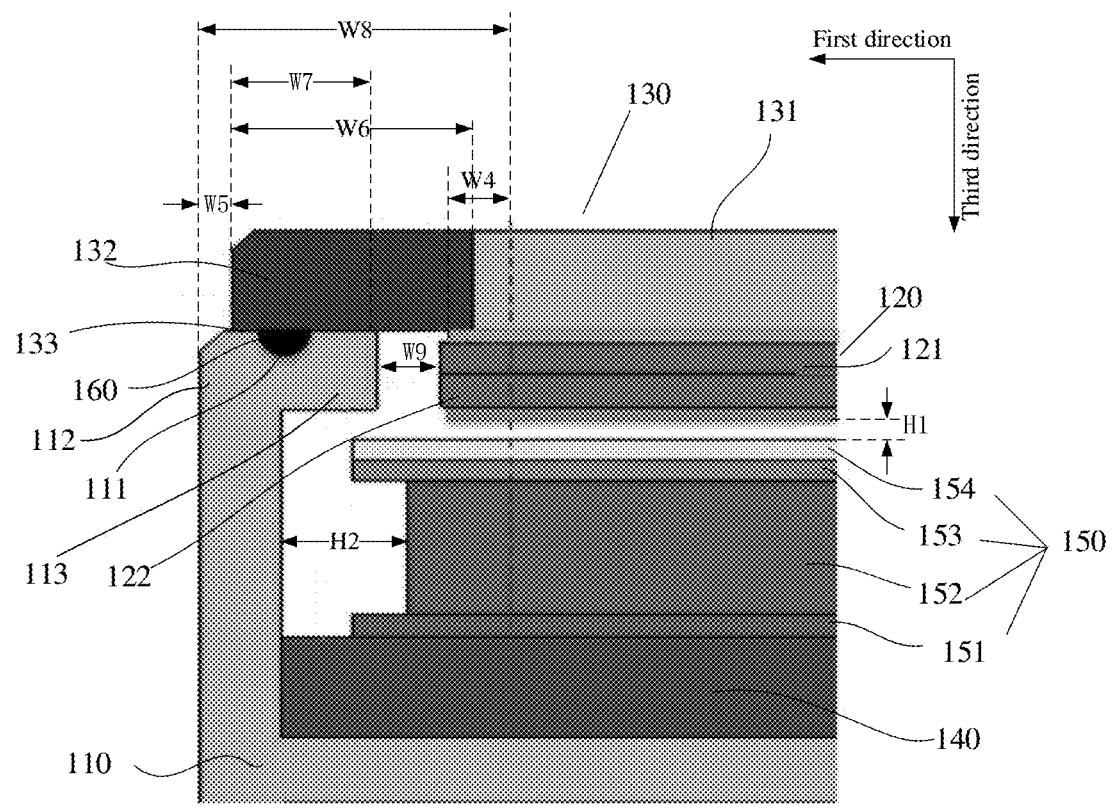
FIG. 2 is a schematic diagram illustrating a local structure of a display assembly, according to an exemplary embodiment.

In the description of the disclosure, orientations or position relations indicated by terms such as "top", "bottom", "inner", "outer" and "vertical" are based on orientations or position relations shown in FIG. 2.

FIG. 2 is a schematic diagram illustrating a display assembly, according to an exemplary embodiment. As shown in FIG. 2, the display assembly may include: a frame (bezel) 110, a display panel 120, and a protective glass 130.

The display panel 120 is attached onto an inner surface of the protective glass 130 to form an integrated structure. An edge of the inner surface of the protective glass 130 extends beyond the display panel 120, and the edge of the inner surface of the protective glass 130 is bonded to a surface of a side wall of the frame 110 by a bonding agent 160.

In embodiments of the disclosure, the display panel 120 is indirectly fixed on the frame 110 by the protective glass 130, and the display panel 120 itself is not in contact with the frame 110. As for the display panel 120 with a relatively small black edge area 122, the display panel 120 does not need to realize a connection with the protective glass 130 by the black edge area 122, and the display panel 120 can be installed by the part, extending beyond the display panel 120, of the protective glass 130. This installation mode may not be influenced by the width of the black edge area 122 of the display panel 120. An installation space of the display panel 120 can be increased by the protective glass 130 and thus the display panel can be installed conveniently.

Figure 3:
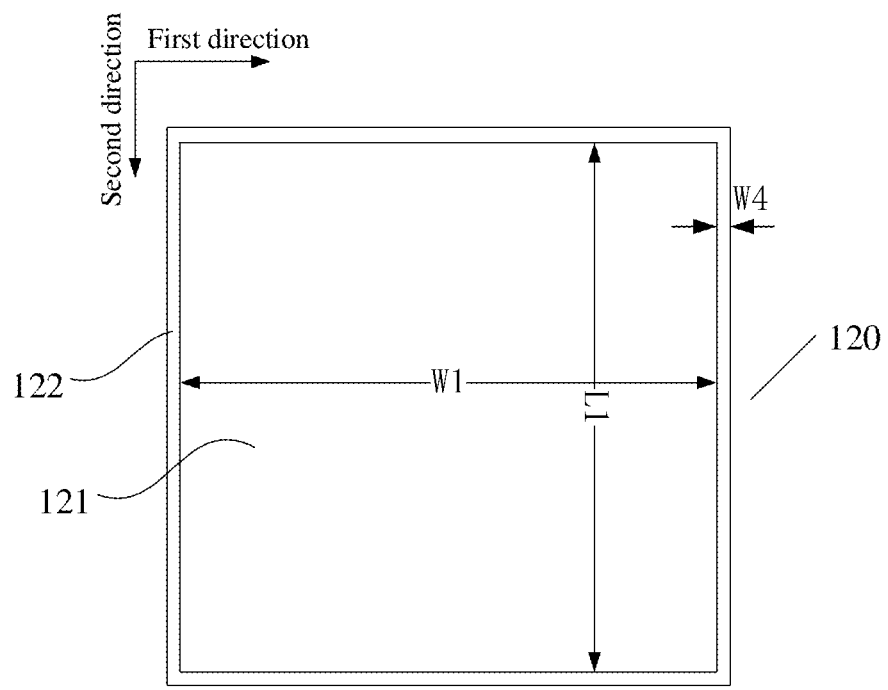
FIG. 3 is a schematic diagram illustrating a local structure of a display panel in a display assembly, according to an exemplary embodiment.

FIG. 3 is a schematic diagram illustrating a local structure of a display panel in a display assembly, according to an exemplary embodiment. As shown in FIG. 3, even if the width of the black edge area 122 of the display panel 120 is 0.9 mm or smaller than 0.9 mm, installation can be performed conveniently. In the embodiment, the black edge area 122 of the display panel 120 can also have a width greater than 0.9 mm, such as a width 6.5 mm. The display panel 120 with the relatively small black edge area 122 can be used, so that a screen-to-body ratio can be increased.

Referring back to FIG. 2, the protective glass 130 is installed on the surface of the side wall of the frame 110. Except for a projecting part 112 of the side wall of the frame which projects slightly outward from the edge of the protective glass 130, nearly the whole side wall of the frame 110 is located below the protective glass 130. The inner surface of the protective glass 130 is bonded to the surface of the side wall of the frame 110. The whole protective glass 130 can be seen from a front face of the display assembly. In some embodiments, the frame 110 is nearly invisible. This arrangement improves user experience. As shown in FIG. 2, while impacted by an external force, the projecting part 112 of the frame 110 bears the force at first, so that the projecting part 112 of the frame 110 can be used for enhancing protection of the protective glass 130.

In an embodiment, the inside of the frame 110 has an opening configured to install the display panel 120, and the display panel 120 is installed inside the opening. A center area 131 of the protective glass 130 covers the display panel 120, and an edge area 132, extending beyond the display panel 120, of the protective glass 130 is bonded to the surface of the side wall of the frame 110 by a bonding agent 160, in which the center area 131 is located inside the edge area 132 Images displayed on the display panel 120 can be observed through the protective glass 130, and the display effect of the display panel 120 is not influenced.

Figure 4:
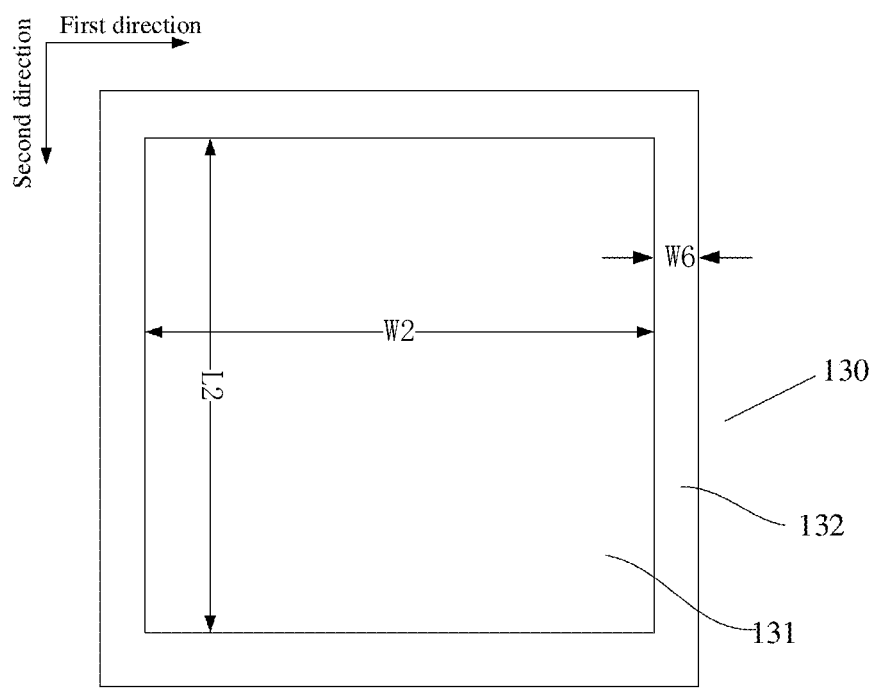
FIG. 4 is a schematic structural diagram of a protective glass in a display assembly, according to an exemplary embodiment.

The display effect can be taken into comprehensive account during design of the size of the display panel 120 and the size of the protective glass 130. In an embodiment, in order to avoid shielding a display area 121 as much as possible, which can influence the display effect of the display panel 120, an area of the center area 131 of the protective glass 130 is not smaller than an area of the display area 121 of the display panel 120. For example, as shown in FIG. 3, a width of the display area 121 of the display panel 120 in a first direction is assumed to be W 1. FIG. 4 is a schematic structural diagram of a protective glass in a display assembly, according to an exemplary embodiment, and as shown in FIG. 4, a width of the center area 131 of the protective glass 130 in the first direction is assumed to be W2, so that W1 is equal to or smaller than W2. A width of the display area 121 of the display panel 120 in a second direction is assumed to be L1, and a width of the center area 131 of the protective glass 130 in the second direction is assumed to be L2, so L1 is equal to or smaller than L2. In this way, the display area 121 of the display panel 120 is completely visible.

In an embodiment, the protective glass 130 is tempered glass. For example, super white tempered glass can be selected. The super white tempered glass has a high transparency and thus can reduce influences on image quality. The frame 110 may be a metal frame 110, such as an aluminum alloy frame 110. The metal frame 110 can satisfy demands of users for appearances and can also help improve strength and heat dissipation effect of the display assembly.

In some embodiments, a first gap is formed between the display panel 120 and the side wall of the frame 110, an edge area 132 of the inner surface of the protective glass 130 has a light shielding layer 133 for shielding the first gap, as well as shielding a part of a surface of the frame 110 and a part of the display panel 120.

As shown in FIG. 2, the first gap is a spacing W9 between the display panel 120 and the side wall of the frame 110 forming the opening, and the first gap corresponds to the edge area 132 of the protective glass 130.

The first gap is used to adapt to a volume expansion of the display panel 120, which may be caused by temperature changes. In an embodiment, as shown in FIG. 2, the spacing W9 between the edge of the display panel 120 and the side wall of the frame 110 is 0.5 mm-1.2 mm, for example, the spacing can be set to be 0.6 mm, 0.7 mm, 0.9 mm and the like according to demands.

In the embodiments of the disclosure, the protective glass 130 not only shields a part of the surface of the frame 110, but also shields the first gap, so that the visible display assembly frame 110 is reduced, a sense of presence of the frame 110 is further weakened, and user experience is improved.

Figure 1:
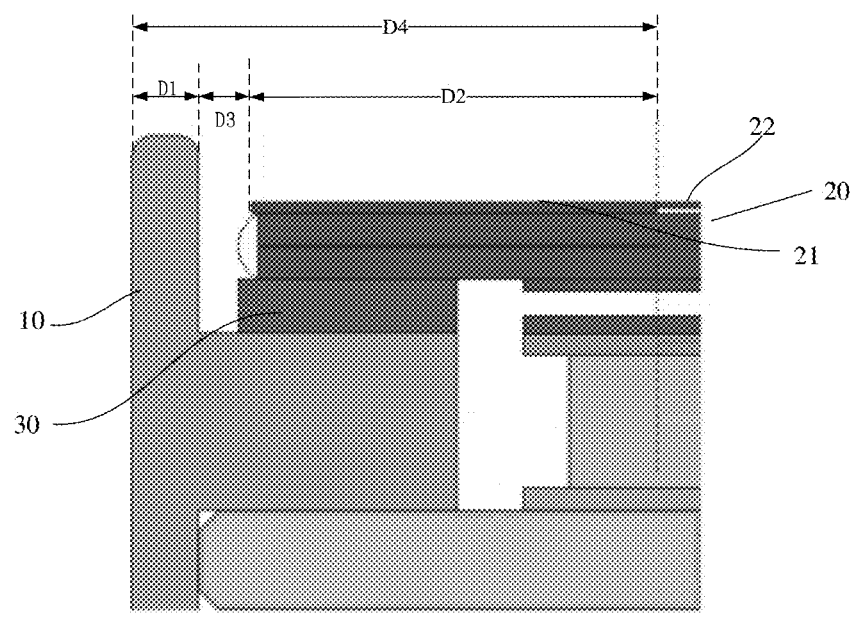
FIG. 1 is a schematic diagram showing a local structure of a conventional display assembly.

For example, comparing FIG. 2 with FIG. 1 where the frame 110 is not included, the rightmost dotted lines in FIG. 1 and FIG. 2 denote a boundary between the black edge area 122 and the display area 121 of the display panel 120. In FIG. 2, a width W4 of the black edge area 122 of the display panel 120 in the first direction is 0.9 mm, a width W5 of the projecting part 112 of the frame 110 that projects outward from the edge of the protective glass 130 is 0.4 mm. As observed from the outside of the display assembly, the light shielding layer 133 can shield a part of a display boundary area, and only the protecting part 112 with the width W5 0.4 mm, of the frame 110 is visible, so that the sense of presence of the frame 110 is weakened. A width W8, in the first direction, of the display boundary area of the display assembly which cannot display images is equal to a sum of the width W5 of the projecting part 112, a width W7 of a portion, installed on the frame 110, of the edge area 132 of the protective glass 130, a width W9 of the first gap and the width W4 of the black edge area 122, namely W8=W5+W7+W9+W4=3.6 mm. As shown in FIG. 1, the display assembly has a visual effect of presence of the frame 10. In addition, as shown in FIG. 1, in the first direction, nearly the whole side wall of the display frame 10 is exposed outside, a width D1 of the exposed part is 1.0 mm, a width D2 of the black edge area 22 of the display panel 20 is 6.5 mm, a first gap between the display panel 20 and the side wall of the frame 10 is also exposed outside, a width D3 of the gap is 0.9 mm, and the width of the display boundary area is D4=D1+D2+D3=8.4 mm, which is far larger than W8=3.6 mm in FIG. 2. Therefore, the display boundary area in the embodiments of the disclosure is narrower, and the invisible effect of the frame 110 of the display assembly is better.

The light shielding layer 133 is configured to shield the frame 110 which can be seen from one side of the protective glass 130 and shield an inner structure of the frame 110. As for a backlight display panel 120, the light shielding layer 133 can also guarantee that light rays are not leaked from the inside of the frame 110. The edge area 132 in which the light shielding layer 133 is located surrounds externally the center area 131 of the protective glass 130, the center area 131 of the protective glass 130 can be transmitted by light, and display images of the display panel 120 can be seen through the center area 131.

Since the protective glass 130 constitutes an appearance part of the display assembly, for the purpose of obtaining a high screen-to-body ratio and enhancing the frame-free effect, it is only needed for the size of the edge area 132 of the protective glass 130 to meet the size required by installation of the frame 110 as well as to shield the first gap. As shown in FIG. 2, the size of the edge area 132 of the protective glass 130 includes a width W6 of the edge area 132 of the protective glass 130 in the first direction and a length in the second direction. The width W7 of the portion, installed on the frame 110, of the edge area 132 of the protective glass 130 is 1.2-3.0 mm, so W6 is larger than W7. For example, W7 may be 1.5 mm, 1.7 mm, 2.2 mm, 3.0 mm, etc.

There may be no gap between the light shielding layer 133 and the black edge area 122 of the display panel 120. With the gap-free structure, it can be ensured that the arrangement inside the frame 110 cannot be observed via the protective glass 130 and the light rays in the frame 110 are not leaked. The light shielding layer 133 can be exactly linked with the black edge area 122 of the display panel 120, or the light shielding layer 133 can overlap the black edge area 122 of the display panel 120. In other words, in a projection in a third direction, the light shielding layer 133 and the black edge area 122 of the display panel 120 are disposed in a staggered or overlapped manner. FIG. 2 exemplarily illustrates that in the projection in the third direction, the light shielding layer 133 and the black edge area 122 of the display panel 120 are disposed in an overlapped manner.

In some embodiments, the light shielding layer 133 includes a silkscreen layer which is formed in the edge area 132 of the inner surface of the protective glass 130 by a silkscreen technology.

The silkscreen layer is generally black. For example, a black ink or coating material may be printed on the edge area 132 of the inner surface of the protective glass 130, and then the silkscreen layer is formed in the edge area 132 of the inner surface of the protective glass 130 after the ink or coating material is dried. The silkscreen layer can shield the inner structure of the frame 110 and can shield light.

Apart from using the silkscreen technology to form the silkscreen layer, other methods may be used for forming the light shielding layer 133. For example, the light shielding layer 133 includes: a coating formed in the edge area 132 of the inner surface of the protective glass 130 by a coating method; or a light shielding film which is attached onto the edge area 132 of the inner surface of the protective glass 130. For example, the light shielding film is bonded to the edge area 132 of the inner surface of the protective glass 130 by a double sided tape or a bonding agent.

In some embodiments, the side wall of the frame 110 has an extension part 113, to enlarge a contact face between the surface of the frame 110 with the inner surface of the protective glass 130.

As shown in FIG. 2, the side wall of the frame 110 is of a bending structure, the opening of the frame 110 is formed by the enclosure of the extension part 113, and the extension part 113 increases the area of the installation contact face between the frame 110 and the inner surface of the protective glass 130, to facilitate enhancing the fixation effect between the frame 110 and the protective glass 130. In addition, the extension part 113 projects towards the center of the frame 110. When the protective glass 130 is installed, the extension part 113 can be shielded by the light shielding layer 133, and the narrow frame 110 effect of the display assembly is not influenced.

In some embodiments, there is a groove 111 in a position in which the frame 110 is bonded to the protective glass 130; and the bonding agent 160 for bonding the protective glass 130 is disposed in the groove 111.

The bonding agent 160 inside the groove 111 includes, but is not limited to, an acrylic polymer adhesive or an epoxy resin adhesive.

In some embodiments, the bonding agent 160 is disposed in the groove 111 by an adhesive dispensing technology.

In an embodiment, the bonding agent can be dropped or smeared in the groove 111 by an adhesive dispensing device, then the protective glass 130 is placed on the frame 110, and the protective glass 130 can be bonded fixedly on the frame 110 after curing of the bonding agent 160. In general, for the purpose of guaranteeing an enough large opening of the frame 110 to facilitate assembly of the display assembly, the area of a docking face of the frame 110 facing the protective glass 130 is small, and the accuracy of adhesive dispensing needs to be improved during adhesive dispensing.

As for the bonding agent with low viscosity and good liquidity, the arrangement of the groove 111 can effectively guarantee flowing of the bonding agent 160 along an arrangement area of the groove 111, thereby reducing pollution brought by the bonding agent 160 to other areas of the display assembly. In addition, the groove 111 may not be disposed, and the bonding agent 160 may be directly applied to the docking face, facing the protective glass 130, of the frame 110.

In some embodiments, as shown in FIG. 2, the display assembly further includes: a backlight component 150 which is located on a back face of the display panel 120 and configured to provide display light rays; and a back plate 140 which is located on the back face of the backlight component 150 and installed in the frame 110 to carry the backlight component 150.

For example, besides a light source, the backlight component 150 further includes a reflector sheet 151, a light guide plate 152, a brightness enhancement film 153 (also referred to as a prism film), a diffuser 154 and the like which are arranged successively from bottom to top. The light source may be of a lateral light type or a direct radiation type. Mobile phones, laptops and monitors mainly adopt lateral light type backlight assemblies, and LCD televisions mainly adopt direct radiation type light sources. The light source includes but is not limited to a Cold Cathode Fluorescent Lamp (CCFL) and a Light-emitting Diode (LED). The reflector sheet 151 is also referred to as a reflection shield, which is configured to completely send light rays emitted by the light source into the light guide plate 152, so that non-beneficial loss can be reduced as much as possible. The light guide plate 152 is configured to guide the light rays emitted by the lateral light source to the front face of the panel. The brightness enhancement film 153 is configured to centralize various scattered light rays at a certain angle through refraction and total reflection of the film layer and then emit them from a backlight source, so that a display effect of screen brightness enhancement can be realized. As for the lateral light type backlight component 150, the diffuser 154 is configured to correct the back lateral light rays to a uniform area light, so as to realize an optical diffusion effect. The backlight assembly provides sufficient brightness and the uniformly distributed light rays for normal image display of the display panel 120.

In some embodiments, the back plate 140 is an iron-plastic plate or an aluminum-plastic plate.

In the embodiments of the disclosure, the shape of the display panel 120 is not restricted. The display panel 120 may be a planar screen or a curved screen. When the display panel 120 is a curved screen, the protective glass 130 is also curved correspondingly. The display assembly includes but is not limited to a television, a tablet computer, a mobile phone, a laptop and a desktop display, etc.

In some embodiments, as shown in FIG. 2, a second gap H1 is formed between a light exiting surface of the backlight component 150 and the back face of the display panel 120. The second gap H1 can reserve a space for a thermal expansion of the backlight component 150 in a vertical direction so as to ensure normal use of the display assembly.

Further, a third gap is formed between an edge of the backlight component 150 and the side wall of the frame 110, and the third gap can reserve space for the thermal expansion of the backlight assembly 150 in the first direction as shown in FIG. 2. The third gap includes a gap H2 between the light guide plate 152 and the frame 110. In an embodiment, H2=1.2-2.5 mm. For example, 1.2 mm, 1.5 mm, 1.6 mm, 1.8 mm or 2.5 mm can be selected as H2 as needed.

In some embodiments, the display panel 120 is a passive light-emitting display panel, namely an Open Cell (OC). The passive light-emitting display panel 120 means that a Liquid Crystal Display (LCD) technology is used, the OC may not emit light itself, light rays are provided by the light source in the backlight component 150 and thus light emitting of the display panel 120 is realized.

In some embodiments, the display panel 120 may also be an active light-emitting display panel. The active light-emitting mode refers to a light-emitting mode with use of an Organic Light-Emitting Diode (OLED) technology, namely the display panel 120 is constituted by an LED array and a display unit of each OLED can generate three different colors of light in a controllable manner. Therefore, the display device does not need the backlight component 150 and can realize light emitting without the light source.

In some embodiments, a bonding layer is disposed between the protective glass 130 and the display panel 120; and the display panel 120 and the inner surface of the protective glass 130 are bonded together by the bonding layer.

Further, a space between the protective glass 130 and the display panel 120 is fully provided with the bonding layer. The edge of the bonding layer is located at the light shielding layer 133, and the bonding layer extends from the center of the protective glass 130 to the light shielding layer 133. That is, the protective glass 130 is completely attached to the display panel 120. The completely attaching can ensure that the protective glass 130 and the display panel 120 are completely bonded together without a gap, so that air between the display panel 120 and the protective glass 130 can be restrained, to reduce light ray reflection and exiting light ray loss, thereby enhancing brightness and improving display effect. Compared with the fixation with the double sided tape as shown in FIG. 1, the yield is higher.

Better effect can be achieved through completely attaching, but border bonding is not excluded in the embodiments of the disclosure, namely the protective glass 130 and the display panel 120 are fixed along four edges with the bonding agent or the double sided tape, and a bonding layer is in a shape of square. In addition, the attaching between the protective glass 130 and the display panel 120 can be realized by other modes such as fusion welding.

In some embodiments, the bonding layer between the protective glass 130 and the display face of the display panel 120 may be a transparent bonding layer. The transparent bonding layer can increase a transmission rate of the light rays and reduce the influence on the image quality of the display panel 120.

In some embodiments, the bonding layer includes a photosensitive bonding agent. The photosensitive adhesive includes but is not limited to an acrylic acid or acrylics adhesive. The adhesive of this type has a good light transmission. The bonding agent between the protective glass 130 and the display face of the display panel 120 can be cured by UV illumination. Thus, it is easy to use.

In an embodiment, the display assembly is used in a television. For example, as shown in FIG. 2, the black edge area 122 of the display panel 120 is 0.9 mm wide, and the display panel 120 cannot be assembled directly with the frame 110 by an adhesive dispensing process. The assembly space is increased through the completely attaching between the tempered protective glass 130 and the OC. Then, the tempered protective glass 130 is fixed on the frame 110 through accurate adhesive dispensing. Only the whole tempered protective glass 130 is visible on the front face of the television, and the sense of presence of the frame 110 is weak. In addition, a silkscreen is made on the tempered protective glass 130 to shield the inner structure. A UV adhesive with a thickness of 0.1 mm is used for the completely attaching between the tempered glass and the display panel 120. The super white optical glass is used as the tempered glass, so the image quality is not influenced. As shown in FIG. 2, the first gap W9 is 0.6 mm, the width W5 of the protecting part 112 of the frame 110 protecting outward from the edge of the protective glass 130 is 0.4 mm, the width W7 of the portion, installed on the frame 110, of the edge area 132 of the protective glass 130 is 1.7 mm, and the width W4 of the black edge area 122 is 0.9 mm, so that the width of the display boundary area is W8=W5+W7+W9+W4=0.4+1.7+0.6+0.9=3.6 mm Compared to a conventional display, the display panel 120 with the narrow black edge area 122 is used, and thus the screen-to-body rate is higher.

Figure 5:
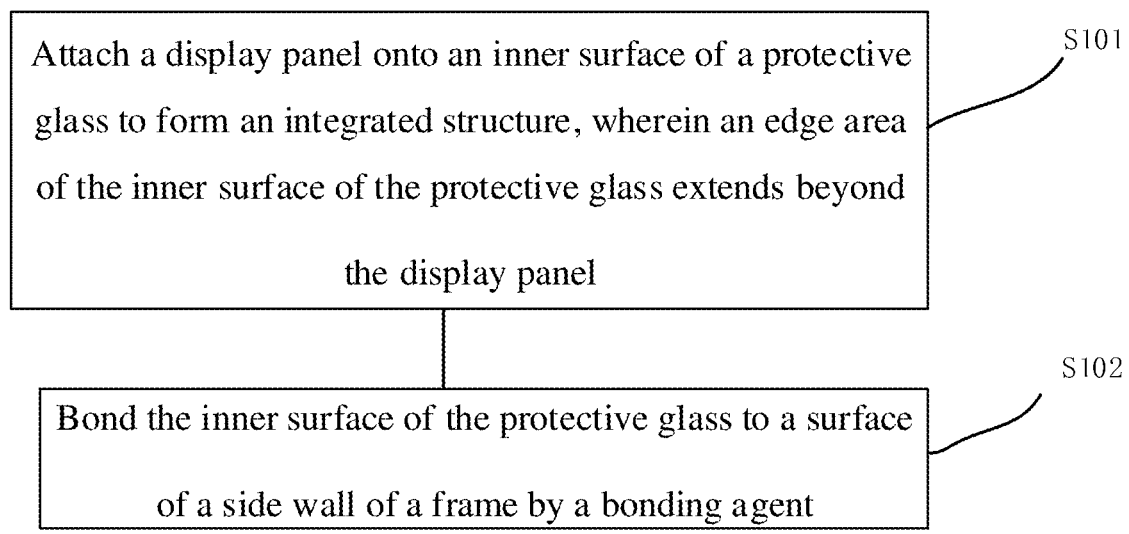
FIG. 5 is a flow chart illustrating a manufacturing method for a display assembly, according to an exemplary embodiment.

FIG. 5 is a flow chart illustrating a manufacturing method for the display assembly described above, according to an exemplary embodiment. As shown in FIG. 5, the manufacturing method may include the following steps:

In step S101, a display panel is attached onto an inner surface of a protective glass to form an integrated structure, wherein an edge area of the inner surface of the protective glass extends beyond the display panel.

In step S102, the inner surface of the protective glass is bonded to a surface of a side wall of a frame by a bonding agent.

For example, as shown in FIG. 2, the protective glass 130 covers a center area 131 of the display panel 120, so that a fixation between the protective glass 130 and the display panel 120 can be realized, and then an edge area 132 of the protective glass 130 is bonded fixedly with the frame 110. At this moment, the display panel 120 is installed inside an opening of the frame 110.

The protective glass 130 is installed on the surface of the side wall of the frame 110. Nearly the whole side wall of the frame 110 is located below the protective glass 130. The inner surface of the protective glass 130 is bonded to the surface of the side wall of the frame 110. The whole protective glass 130 can be seen from the front face of the display assembly. In practical application, the frame 110 nearly cannot be seen, so user experience is improved. In addition, the display panel 120 is indirectly fixed on the frame 110 by the protective glass 130, and the display panel 120 itself is not in contact with the frame 110. It is not necessary for the display panel 120 with a small black edge area 122 to realize a connection with the protective glass 130 by the black edge area 122. The installation of the display panel 120 can be achieved by the part, extending beyond the display panel 120, of the protective glass 130. This installation mode is not influenced by the width of the black edge area 122 of the display panel 120. An installation space of the display panel 120 can be increased by the protective glass 130 and thus the display panel can be installed conveniently. As the display panel 120 with the small black edge area 122 can be used, and thus the screen-to-body ratio can be increased.

In an embodiment, the manufacture method for the display assembly further includes: forming a light shielding layer 133 on the edge area 132 of the inner surface of the protective glass 130.

In an embodiment, bonding the inner surface of the protective glass 130 to the surface of the side wall of the frame 110 by the bonding agent, includes: reserving a first gap between the display panel 120 and the side wall of the frame 110, in which the light shielding layer 133 shields the first gap and shields a part of a surface of the frame 110 and a part of the display panel 120.

In an embodiment, forming the light shielding layer 133 may be carried out before S101 or after S101. The light shielding layer 133 can be exactly linked with the edge of the display panel 120, namely the light shielding layer 133 is linked with the black edge area 122 of the display panel 120. Alternatively, the light shielding layer 133 can exactly overlap the edge of the display panel 120, namely the light shielding layer 133 overlaps the black edge area 122 of the display panel 120. With the design, the structure inside the frame 110 may not be observed via the protective glass 130 and the light rays in the frame 110 are not leaked.

In some embodiments, forming the light shielding layer 133 in the edge area 132 of the inner surface of the protective glass 130 includes: forming the light shielding layer 133 on the edge area 132 of the inner surface of the protective glass 130 by a silkscreen technology.

For example, an ink or a coating material may be printed on the edge area 132 of the inner surface of the protective glass 130, and then a silkscreen layer is formed in the edge area 132 of the inner surface of the protective glass 130 after the ink or coating material is dried. The silkscreen layer can shield the inner structure of the frame 110 and can shield light.

Apart from using the silkscreen technology to form the silkscreen layer, other methods may be used to form the light shielding layer 133. For example, the light shielding layer 133 includes: a coating formed in the edge area 132 of the inner surface of the protective glass 130 by a coating method; or a light shielding film which is bonded to the edge area 132 of the inner surface of the protective glass 130, specifically by a double sided tape or a bonding agent.

In some embodiments, attaching the display panel 120 onto the inner surface of the protective glass 130 to form the integrative structure, wherein the edge area 132 of the inner surface of the protective glass 130 extends beyond the display panel 120, includes: applying the bonding agent between the protective glass 130 and a display face of the display panel 120; bonding the display panel 120 to the center area 131 of the inner surface of the protective glass 130 by the bonding agent; and curing the bonding agent to form a bonding layer, wherein a space between the display panel 120 and the center area 131 of the protective glass 130 is full of the bonding layer.

The bonding agent between the protective glass 130 and the display panel 120 may be the same as or different from the type of the bonding agent located inside the groove 111. For example, the bonding agent between the protective glass 130 and the display panel 120 may be a transparent bonding agent, while the bonding agent inside the groove 111 may not be a transparent bonding agent. The transparent bonding layer formed by the transparent bonding agent can increase a transmission rate of the light rays and reduce influences on image quality of the display panel 120.

The space between the display panel 120 and the center area 131 of the protective glass 130 is full of the bonding layer, namely the protective glass 130 is completely attached to the display panel 120. The completely attaching can ensure that the protective glass 130 and the display panel 120 are completely bonded together without a gap, so that air between the display panel 120 and the protective glass 130 can be restrained, so as to reduce light ray reflection and existing light ray loss, thereby enhancing brightness and improving display effect. Compared with the fixation with the double sided tape as shown in FIG. 1, the yield is higher.

With the completely attaching, better effect can be achieved, but border bonding is not excluded in the embodiments of the disclosure, namely the protective glass 130 and the display panel 120 are fixed along four edges with the bonding agent or the double sided tape. The bonding layer is in a shape of square.

Other embodiments of the disclosure will be apparent to those skilled in the art from consideration of the specification and practice of the invention disclosed here. The disclosure is intended to cover any variation, use, or adaptation of the disclosure following the general principles thereof and including such departures from the present disclosure as come within known or customary practice in the art. It is intended that the specification and embodiments are considered as being exemplary only, with a true scope and spirit of the disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. A display assembly, comprising:
a frame, a display panel, and a protective glass;
wherein the display panel is attached onto an inner surface of the protective glass to form an integrated structure,
an edge area of the inner surface of the protective glass extends beyond the display panel,
the edge area of the inner surface of the protective glass is bonded to a surface of a side wall of the frame by a bonding agent,
a gap is formed between the display panel and the side wall of the frame,
the edge area of the inner surface of the protective glass comprises a light shielding layer, and the light shielding layer shields the gap and shields a part of a surface of the frame and a part of the display panel.

2. The display assembly according to claim 1, wherein the light shielding layer comprises a silkscreen layer which is formed in the edge area of the inner surface of the protective glass by a silkscreen technology.

3. The display assembly according to claim 1, wherein the side wall of the frame comprises an extension part, and the extension part is in contact with the surface of the frame and the inner surface of the protective glass respectively.

4. The display assembly according to claim 1, wherein a groove is formed in a position in which the frame is bonded to the protective glass, and the groove contains the bonding agent for bonding the protective glass.

5. The display assembly according to claim 4, wherein the bonding agent is disposed in the groove by an adhesive dispensing technology.

6. The display assembly according to claim 1, wherein the display assembly further comprises:
- a backlight component, located on a back face of the display panel and configured to provide display light rays; and
- a back plate, located on a back face of the backlight assembly and installed in the frame to carry the backlight component.

7. The display assembly according to claim 6, wherein a gap is formed between a light exiting surface of the backlight component and the back face of the display panel.

8. The display assembly according to claim 1, wherein a bonding layer is disposed between the protective glass and the display panel; and the display panel and the inner surface of the protective glass are bonded together by the bonding layer.

9. The display assembly according to claim 8, wherein the bonding layer comprises a photosensitive bonding agent.

10. A manufacturing method for a display assembly comprising a frame, a display panel, and a protective glass, the manufacturing method comprising:

attaching the display panel onto an inner surface of the protective glass to form an integrated structure, wherein an edge area of the inner surface of the protective glass extends beyond the display panel;

bonding the inner surface of the protective glass to a surface of a side wall of the frame by a bonding agent; and forming a light shielding layer in the edge area of the inner surface of the protective glass;

wherein the bonding the inner surface of the protective glass to the surface of the side wall of the frame by the bonding agent comprises:

reserving a gap between the display panel and the side wall of the frame, wherein the light shielding layer shields the gap and shields a part of a surface of the frame and a part of the display panel.

11. The manufacturing method according to claim 10, wherein the forming the light shielding layer on the edge area of the inner surface of the protective glass comprises:

forming the light shielding layer in the edge area of the inner surface of the protective glass by a silkscreen technology.

12. The manufacturing method according to claim 10, wherein the attaching the display panel onto the inner surface of the protective glass to form the integrative structure, comprises:

applying a bonding agent between the protective glass and a display face of the display panel;

bonding the display panel to a center area of the inner surface of the protective glass by the bonding agent; and curing the bonding agent to form a bonding layer, wherein a space between the display panel and the center area of the protective glass is full of the bonding layer.

* * * * *